United States Patent
Park

(10) Patent No.: US 9,140,743 B2
(45) Date of Patent: Sep. 22, 2015

(54) SEMICONDUCTOR SYSTEM THAT TESTS THE CONNECTIVITY BETWEEN A METAL AND A BUMP THAT ARE FORMED IN THE UPPER PORTION OF A PENETRATING ELECTRODE

(71) Applicant: SK hynix Inc., Gyeonggi-do (KR)

(72) Inventor: Heat-Bit Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/328,357

(22) Filed: Jul. 10, 2014

(65) Prior Publication Data

US 2015/0198653 A1  Jul. 16, 2015

(30) Foreign Application Priority Data

Jan. 16, 2014 (KR) .................. 10-2014-0005545

(51) Int. Cl.
*H01L 23/00* (2006.01)
*G01R 31/26* (2014.01)
*H01L 23/48* (2006.01)
*H01L 23/498* (2006.01)

(52) U.S. Cl.
CPC .......... *G01R 31/2607* (2013.01); *H01L 23/481* (2013.01); *H01L 23/49816* (2013.01); *H01L 23/49827* (2013.01); *H01L 24/13* (2013.01); *H01L 24/16* (2013.01); *H01L 24/81* (2013.01); *H01L 2224/13016* (2013.01); *H01L 2224/13025* (2013.01); *H01L 2924/1304* (2013.01)

(58) Field of Classification Search
CPC .................. H01L 2924/15311; H01L 23/481; H01L 24/16; H01L 2224/81; H01L 23/49827; H01L 24/81; H01L 23/49816; H01L 2224/16
See application file for complete search history.

(56) References Cited

U.S. PATENT DOCUMENTS

| | | | | |
|---|---|---|---|---|
| 2012/0104580 A1* | 5/2012 | Feng et al. | ..................... | 257/673 |
| 2012/0286814 A1* | 11/2012 | Wang et al. | ............... | 324/754.03 |
| 2015/0115435 A1* | 4/2015 | Park et al. | ..................... | 257/737 |

FOREIGN PATENT DOCUMENTS

| | | |
|---|---|---|
| KR | 1020120040365 | 4/2012 |
| KR | 1020130072854 | 7/2013 |

* cited by examiner

*Primary Examiner* — Ngan Ngo
(74) *Attorney, Agent, or Firm* — IP & T Group LLP

(57) ABSTRACT

A semiconductor system includes a semiconductor chip; a penetrating electrode, which is formed to penetrate the semiconductor chip; two or more metals, which are formed in the upper portion of the penetrating electrode; a bump, which is formed to contact the upper portions of the metals and supplies a data signal inputted from outside to the metals; a detection block suitable for detecting whether or not the bump is coupled with the metals by comparing voltage levels of the metals with each other and generating a decision signal; and a signal output block suitable for outputting the decision signal externally.

15 Claims, 3 Drawing Sheets

US 9,140,743 B2

SEMICONDUCTOR SYSTEM THAT TESTS THE CONNECTIVITY BETWEEN A METAL AND A BUMP THAT ARE FORMED IN THE UPPER PORTION OF A PENETRATING ELECTRODE

CROSS-REFERENCE TO RELATED APPLICATIONS

The present application claims priority of Korean Patent Application No. 10-2014-0005545, filed on Jan. 16, 2014, which is incorporated herein by reference in its entirety.

BACKGROUND

1. Field

Exemplary embodiments of the present invention relate to a semiconductor design technology, and, more particularly, to a semiconductor device and system capable of detecting whether a semiconductor chip is coupled with a bump, and a method for driving the semiconductor device and system.

2. Description of the Related Art

Packaging technology for semiconductor integrated circuits has continuously developed to satisfy users' needs for miniaturization and reliability. The demand for performance and miniaturization has led to various technologies being developed for stacked packages. In order to improve the integration degree of semiconductor devices, three-dimensional (3D) technologies, where a plurality of memory chips are stacked and packaged into a single chip, are being developed. Among the 3D technologies is the Through Silicon Via (TSV) scheme, where all the stacked memory chips are electrically connected to one another through a silicon via that penetrates the stacked memory chips.

FIG. 1 is a diagram illustrating a Through Silicon Via (TSV) formed inside a semiconductor chip.

Referring to FIG. 1, the Through Silicon Via 101 is formed to penetrate the semiconductor chip 100 using the following method. A through via is formed in the semiconductor chip 100, and a silicon insulation layer 103 may be formed around the through via. A penetrating electrode capable of transmitting electric signals may be formed by filling inside the silicon insulation layer 103 with conductive materials 105. Hereinafter, the Through Silicon Via 101 is referred to as the penetrating electrode.

A metal 120 may be stacked on the upper portion of the penetrating electrode 101. The metal 120 may be formed to cover the upper portion of the penetrating electrode 101 and may be electrically connected to internal circuits of the semiconductor chip 100. The internal circuits of the semiconductor chip 100 may receive signals transmitted through the penetrating electrode 101 from the metal 120 and also may transmit signals to the penetrating electrode 101. A bump 140 may be stacked in the upper portion of the metal 120 and coupled with a penetrating electrode of another semiconductor chip. The metal 120 may be coupled with an input buffer unit 107 and an output buffer unit 109. The metal 120 may be coupled with the input buffer unit 107 and the output buffer unit 109 regardless of whether the bump 140 is opened or not. When the bump 140 and the metal 120 are opened, a floating data voltage may be supplied to the input buffer unit 107, and the floating value may be transmitted from the output buffer unit 109 to a semiconductor controller as a final data.

According to prior art, when the bump and the metal are opened, because they are not normally connected to each other, the semiconductor chip contacting the metal may not operate normally because the floating data is supplied to the semiconductor chip. Accordingly, there may be a problem with the reliability of the semiconductor chip based on whether the semiconductor chip is coupled with the bump.

SUMMARY

Exemplary embodiments of the present invention are directed to a semiconductor system that may test the connectivity between a metal and a bump that are formed in the upper portion of a penetrating electrode.

In accordance with an embodiment of the present invention, a semiconductor device may include a semiconductor chip, a penetrating electrode, which is formed to penetrate the semiconductor chip; two or more metals, which are formed in the upper portion of the penetrating electrode; a bump, which is formed to contact the upper portions of the metals and supplies a data signal inputted from an external source to the metals; a detection block suitable for detecting whether or not the bump is coupled with the metals by comparing voltage levels of the metals and generating a decision signal; and a signal output block suitable for outputting the decision signal externally.

In accordance with another embodiment of the present invention, a semiconductor system may include a semiconductor chip and a semiconductor controller suitable for controlling a test operation by transmitting a command signal and a data signal to the semiconductor chip and for determining a test result in response to a decision signal transmitted from the semiconductor chip, wherein the semiconductor chip includes a penetrating electrode, which is formed to penetrate the semiconductor chip; two or more metals, which are formed in the upper portion of the penetrating electrode; a bump, which is formed to contact the upper portions of the metals and supplies the data signal to the metals in response to the command signal; a detection block suitable for detecting whether the bump is coupled with the metals by comparing the voltage levels of the metals and generating a decision signal; and a signal output block suitable for outputting the decision signal in response to a read command among the command signals.

In accordance with another embodiment of the present invention, a method for driving a semiconductor system may include a semiconductor chip and a semiconductor controller suitable for controlling the semiconductor chip by transmitting a data signal to the semiconductor chip, wherein the semiconductor chip includes a penetrating electrode, which is formed to penetrate the semiconductor chip; two or more metals, which are formed in the upper portion of the penetrating electrode; and a bump, which is formed to contact the upper portions of the metals. The method comprises of inputting the data signal to the bump from the semiconductor controller, generating a decision signal for determining whether the bump is coupled with the metals by comparing the voltage levels of the metals, and outputting the decision signal to the semiconductor controller. The metals may be isolated and not coupled with each other. The generating of the decision signal may include setting the voltage levels of the metals to an initial level when the voltage levels of the metals float. The outputting of the decision signal to the semiconductor controller may include setting an interposer line to the initial voltage level when the interposer line coupling the bump with the semiconductor controller floats.

In accordance with another embodiment of the present invention, a method for driving a semiconductor system may include a semiconductor chip and a semiconductor controller suitable for controlling a test operation by transmitting a write command; a read command; and a data signal to the semiconductor chip, wherein the semiconductor chip includes a penetrating electrode, which is formed to penetrate the semiconductor chip; two or more metals, which are formed in the upper portion of the penetrating electrode; a bump, which is formed to contact the upper portions of the metals. The method comprises of inputting the data signal to the bump from the semiconductor controller in response to the write command, transmitting the data signal inputted to the bump to a core block through the metals, generating a decision signal for determining whether or not the bump is coupled with the metals by comparing voltage levels of the metals, and outputting the decision signal to the semiconductor controller in response to the read command. The metals may be isolated and not coupled with each other. The generating of the decision signal may include setting the levels of the metals to an initial level when the voltage levels of the metals float. The outputting of the decision signal to the semiconductor controller may include selectively outputting the decision signal in response to a test mode signal that is generated based on the read command; and transmitting the selectively-outputted signal to the metals. The outputting of the decision signal to the semiconductor controller may include setting an interposer line to the initial level when the interposer line coupling the bump with the semiconductor controller floats.

DETAILED DESCRIPTION

Hereafter, exemplary embodiments of the present invention will be described in detail with reference to the accompanying drawings. These embodiments are provided so that this disclosure will be thorough and complete, will fully convey the scope of the present invention to those skilled in the art, and are not intended to limit the scope of this invention.

Figure 1:
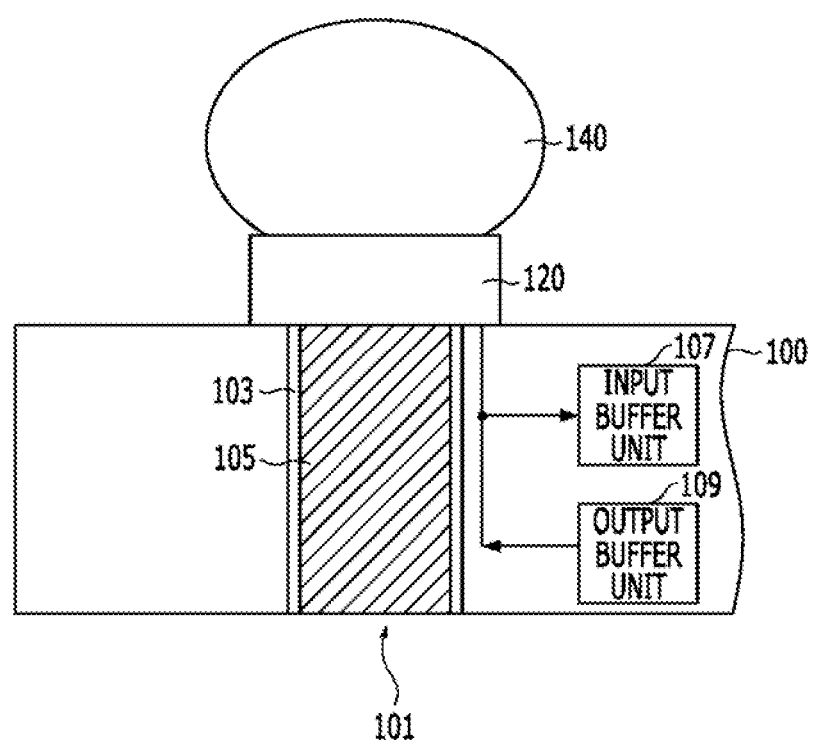
FIG. 1 is a diagram illustrating a Through Silicon Via (TSV) formed inside of a semiconductor chip.
Figure 2:
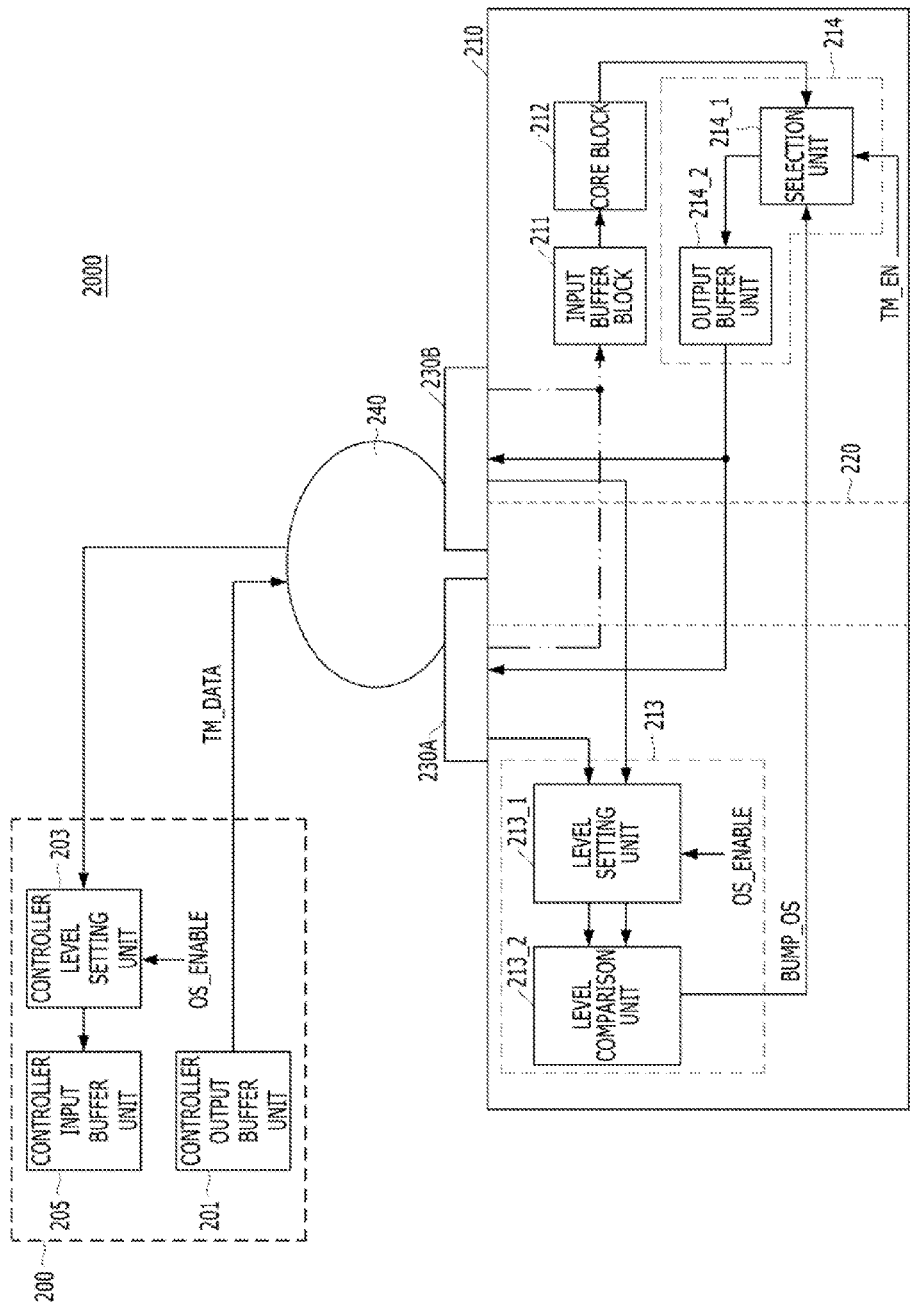
FIG. 2 is a block diagram illustrating a semiconductor system in accordance with an embodiment of the present invention.

FIG. 2 is a block diagram illustrating a semiconductor system in accordance with an embodiment of the present invention.

Referring to FIG. 2, the semiconductor system 2000 may include a semiconductor controller 200 and a semiconductor chip 210. The semiconductor controller 200 may include a controller output buffer unit 201, a controller level setting unit 203, and a controller input buffer unit 205.

In an embodiment of the present invention that will be described as an example, the semiconductor system may include a semiconductor controller, which transmits command and data signals to the semiconductor chip. The embodiment is applicable to all semiconductor devices including semiconductor chips that receive command and data signals from an external source.

The semiconductor system 2000 may include a semiconductor chip 210; a penetrating electrode 220, which is formed to penetrate the semiconductor chip 210; two or more metals 230A and 230B, which are formed on the upper portion of the penetrating electrode 220; and a bump 240, which is formed to contact the upper portions of the metals 230A and 230B. The semiconductor chip 210 may include an input buffer block 211, a core block 212, a detection block 213, and a signal output block 214. The signal output block 214 includes a selection unit 214_1 and an output buffer unit 214_2. The detection block 213 includes a level setting unit 213_1 and a level comparison unit 213_2.

The semiconductor controller 200 controls a test operation by transmitting a write command, a read command, and a data signal to the semiconductor chip 210 and determines a test result in response to a decision signal BUMP_OS transmitted from the semiconductor chip 210. The semiconductor controller 200 supplies the commands and the data signal DATA_SIG to the semiconductor chip 210 through an interposer line (not shown), which couples the semiconductor controller 200 and the semiconductor chip 210 with each other.

The controller output buffer unit 201 may transmit the data signal DATA_SIG to the bump 240 through the interposer line (not shown) in response to an internally generated write command. The controller input buffer unit 205 receives the decision signal BUMP_OS transmitted from the bump 240 through the interposer line (not shown) in response to the read command generated inside the semiconductor controller 200.

The controller level setting unit 203 sets the interposer line to a logic "low" level, which is an initial voltage level given when the decision signal BUMP_OS is transmitted from the bump 240 through the interposer line floats. The controller level setting unit 203 is formed using a transistor, which does not drive the voltage level of the interposer line at the initial level when the controller level setting unit 203 is electrically connected to the interposer line so that the voltage level of the interposer line does not float. A test control signal OS_ENABLE is a signal of a power source voltage VDD, which may be enabled in response to a command and in a test mode. Accordingly, even when the bump 240 is completely opened and uncoupled with the two or more metals, the semiconductor controller 200 may detect whether the bump 240 is coupled to the metals based on reading voltage signals as previously stated. For example, the bump 240 may be determined as being open (not coupled to the metals) based on the decision signal BUMP_OS having the logic "low" level. This initial level may be set to a logic "high" level by a system designer.

The semiconductor chip 210 may include a penetrating electrode 220, which is formed to penetrate the semiconductor chip 210. The penetrating electrode 220 may be formed through via in the semiconductor chip 210, forming a silicon insulation layer and filling the through via with a conductive material. The penetrating electrode 220 may transmit and receive an electric signal through the conductive material.

The two or more metals 230A and 230B may be formed on the upper portion of the penetrating electrode 220, and they may be electrically isolated from each other. For the sake of convenience of description, the metals are divided into a first metal 230A and a second metal 230B, and there may be more metals formed as determined by the system designer.

The first and second metals 230A and 230B may be coupled with the input buffer block 211 and the output buffer unit 214_2 of the semiconductor chip 210. The input buffer block 211 and the output buffer unit 214_2 will be described later.

The bump 240 may be formed to contact the upper portions of both the first and second metals 230A and 230B. The bump 240 may transmit the data signal DATA_SIG inputted from the semiconductor controller 200 to the first and second metals 230A and 230B in response to the write command. The bump 240 may be stacked over the first and second metals 230A and 230B and coupled with a penetrating electrode of another semiconductor chip. When the bump 240 is coupled with the penetrating electrode of another semiconductor chip, two or more semiconductor chips may be stacked and be electrically connected.

The core block 212 in the semiconductor chip 210 may store the data signal DATA_SIG transmitted from the semiconductor controller 200 in response to a write command. As illustrated by the dotted line in FIG. 2, the data signal DATA_SIG is transmitted to the core block 212 through the input buffer block 211, which is coupled with the first and second metals 230A and 230B.

The detection block 213 may detect whether or not the bump 240 is coupled with the first and second metals 230A and 230B by comparing the voltage levels of the first and second metals 230A and 230B with each other and generating the decision signal BUMP_OS. The level setting unit 213_1 of the detection block 213 may set the initial level to a logic "low" level in response to the test control signal OS_ENABLE that is generated internally when the voltage levels of the first and second metals 230A and 230B float. In other words, when one of the first and second metals 230A and 230B is opened while the bump 240 is coupled with the remaining first or second metals 230A or 230B, signals may not be normally transmitted, and the metal that is not coupled with the bump 240 has a floating value. The level setting unit 213_1 may set the floating value to the logic "low" level, which is the initial level. The level setting unit 213_1 may be electrically connected to each of the first and second metals 230A and 230B and set the voltage levels of the first and second metals 230A and 230B to an initial level when the voltage levels of the first and second metals 230A and 230B float. On the other hand, when the voltage levels of the first and second metals 230A and 230B do not float, a plurality of transistors are formed, which do not drive the voltage levels of the first and second metals 230A and 230B to the initial level. The level setting unit 213_1 may have the same structure as the aforementioned controller level setting unit 203 and will be described in detail with reference to the accompanying FIG. 3.

When the voltage levels of the first and second metals 230A and 230B are compared with each other and it turns out that either of the first and second metals 230A and 230B has a logic "low" level, the level comparison unit 213_2 may generate the decision signal BUMP_OS of a logic "low" level.

The signal output block 214 may output the decision signal BUMP_OS from the detection block 213 to the semiconductor controller 200 in response to the read command.

The selection unit 214_1 of the signal output block 214 may selectively output the decision signal BUMP_OS in response to a test mode signal TM_EN generated based on the read command. The output buffer unit 214_2 may be coupled with the first and second metals 230A and 230B and transmit the signal outputted from the selection unit 214_1 to the first and second metals 230A and 230B.

To be specific, the selection unit 214_1 in the signal output block 214 may transmit the decision signal BUMP_OS generated from the detection block 213 to the output buffer unit 214_2 in response to the test mode signal TM_EN generated based on the read command. The selection unit 214_1 may transmit a normal data stored in the core block 212 of the semiconductor chip 210 to the output buffer unit 214_2 in a normal operation. The output buffer unit 214_2 may transmit the decision signal BUMP_OS generated from the detection block 213 to the first and second metals 230A and 230B. The decision signal BUMP_OS transmitted to the first and second metals 230A and 230B may be transmitted to the bump 240, and then transmitted to the controller level setting unit 203 of the semiconductor controller 200 and to the controller input buffer unit 205 through the interposer line (not shown) coupled with the bump 240.

The semiconductor controller 200 may determine whether or not the bump 240 is opened based on the decision signal BUMP_OS transmitted to the controller input buffer unit 205.

Hereafter, an operation of the semiconductor system 200 is described in accordance with an embodiment of the present invention.

(1) A case where the bump 240 is not coupled with the second metal 230B.

The data signal DATA_SIG of a logic "high" level (a power source voltage level) is inputted to the bump 240 from the controller output buffer unit 201 of the semiconductor controller 200 through the interposer line in response to the write command. The data signal DATA_SIG inputted to the bump 240 is transmitted to the input buffer block 211 through the first metal 230A. The input buffer block 211 transmits the data signal DATA_SIG to the core block 212, and the core block 212 stores the data signal DATA_SIG. The detection block 213 maintains the first metal 230A, which is normally coupled with the bump 240, at a logic "high" level, and the level setting unit 213_1 sets the second metal 230B, which is not coupled with the bump 240 and thus has a floating value, to a logic "low" level. The level comparison unit 213_2 generates the decision signal BUMP_OS of a logic "low" level by comparing the voltage level of the first metal 230A, which is a logic "high" level with the voltage level of the second metal 230B, which is a logic "low" level. Subsequently, the detection block 213 transmits the decision signal BUMP_OS to the selection unit 214_1 in response to the read command, and the selection unit 214_1 transmits the decision signal BUMP_OS to the output buffer unit 214_2 in response to the test mode signal TM_EN. The output buffer unit 214_2 transmits the decision signal BUMP_OS to the first and second metals 230A and 230B. Since the second metal 230B is opened with the bump 240, the decision signal BUMP_OS is transmitted to the bump 240 just through the first metal 230A. The bump 240 transmits the decision signal BUMP_OS to the semiconductor controller 200 through the interposer line. Accordingly, the semiconductor controller 200 may determine that the semiconductor chip 210 (i.e. the second metal 230B) and the bump 240 are opened based on the decision signal BUMP_OS of a logic "low" level.

(2) A case where the bump 240 is completely open with the first and second metals 230A and 230B.

The controller output buffer unit 201 of the semiconductor controller 200 inputs the data signal DATA_SIG of a logic "high" level (a power source voltage level) to the bump 240 through the interposer line in response to the write command. However, when the bump 240 and the first and second metals 230A and 230B are completely open, the data signal DATA_SIG transmitted to the bump 240 may not be applied to the first and second metals 230A and 230B. Accordingly, the level setting unit 213_1 of the detection block 213 sets floating values of the first and second metals 230A and 230B to a logic "low" level. The level comparison unit 213_2 generates the decision signal BUMP_OS of a logic "low" level.

Subsequently, the decision signal BUMP_OS of the logic "low" level is transmitted to the output buffer unit 214_2 in response to the test mode signal TM_EN generated based on the read command. The output buffer unit 214_2 transmits the decision signal BUMP_OS to the first and second metals 230A and 230B. However, since the first and second metals 230A and 230B are completely opened with the bump 240, the decision signal BUMP_OS may not be transmitted to the bump 240. Accordingly, a floating signal, which is an initial value of the interposer line, is transmitted from the bump 240 to the semiconductor controller 200 through the interposer line. The controller level setting unit 203 sets the floating value to a logic "low" level. In the end, the semiconductor controller 200 may determine, based on the decision signal BUMP_OS of a logic "low" level, that the bump 240 is opened with the first and second metals 230A and 2306.

The semiconductor system 2000, in accordance with the embodiment of the present invention, tests whether or not the bump 240 is coupled with the two or more first and second metals 230A and 230B and detects the coupling of the bump 240 and the semiconductor chip 210 to improve the reliability of the semiconductor system. Furthermore, since two or more metals contacted with the bump 240 are coupled with the input buffer block 211 and the output buffer unit 214_2 in a normal mode, the semiconductor chip 210 may operate normally even when the bump 240 is opened.

Because setting a signal transmitted from the semiconductor chip 210 to a predetermined level in the semiconductor controller 200 when the signal floats may detect whether the bump 240 is opened, a test may be normally performed even when two or more metals are completely opened with the bump 240.

Figure 3:
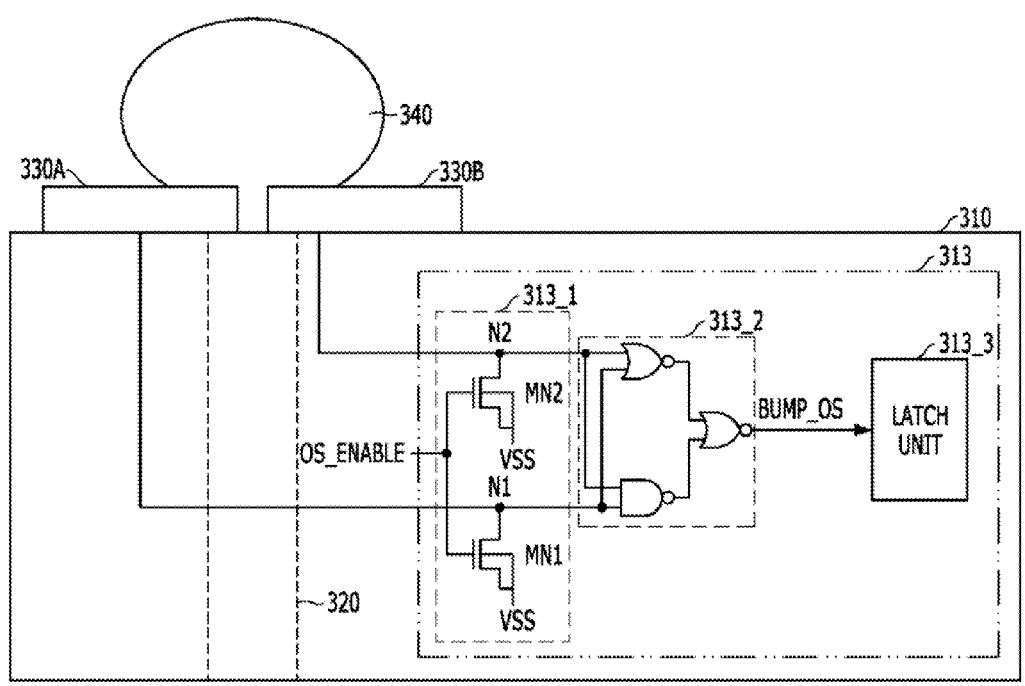
FIG. 3 is a circuit diagram illustrating a detection block shown in FIG. 2.

FIG. 3 is a circuit diagram illustrating in detail the detection block shown in FIG. 2.

Referring to FIG. 3, as described above, a detection block 313 may include a level setting unit 313_1 and a level comparison unit 313_2. The detection block 313 may include a latch unit 313_3 for latching the decision signal BUMP_OS outputted from the level comparison unit 313_2.

The level setting unit 313_1 may be formed of a first NMOS transistor MN1 and a second NMOS transistor MN2, which have a source/drain path where first and second metals 330A and 330B are coupled with a ground voltage VSS. A source/drain region of the first NMOS transistor MN1 may be coupled with a first node N1 of the first metal 330A and the ground voltage VSS, and a gate region of the first NMOS transistor MN1 may be coupled with a test control signal OS_ENABLE. A source/drain region of the second NMOS transistor MN2 may be coupled with a second node N2 of the second metal 330B and the ground voltage VSS, and a gate region of the second NMOS transistor MN2 may be coupled with the test control signal OS_ENABLE. The test control signal OS_ENABLE may be a signal of the power source voltage VDD level. The NMOS transistor of the level setting unit 313_1 may be additionally formed based on a required metal. When the first and second metals 330A and 330B are opened with a bump 340, the first and second metals 330A and 330B may have floating values, which are not normal values, and the level setting unit 313_1 sets the floating values to a logic "low" level, which is an initial level. The first and second NMOS transistors MN1 and MN2 may set the floating values to a logic "low" level when the first node N1 or the second node N2 has a floating value, and when a signal of a logic "high" level, which is the power source voltage VDD level, is supplied, the first and second NMOS transistors MN1 and MN2 may have a driving power that is weak enough to transmit the supplied signal. When the bump 340 is tested to determine if it is open, a logic "high" level, which is the power source voltage VDD level, may be applied from the semiconductor controller, and the transistors are driven with the power source voltage VDD level. Accordingly, when the bump 340 is opened with the first and second metals 330A and 330B, the bump 340 has a floating value, which is not a logic "high" level, and the level setting unit 313_1 sets the floating value to a logic "low" level.

The level comparison unit 313_2 may compare a voltage level of the first node N1 with a voltage level of the second node N2. When signals of the first and second nodes N1 and N2 are at a logic "high" level, the level comparison unit 313_2 may be a logic circuit for outputting the decision signal BUMP_OS at a logic "high" level. In other words, the level comparison unit 313_2 may output the decision signal BUMP_OS of a logic "low" level to the latch unit 313_3 when either of the first and second nodes N1 and N2 is at a logic "low" level.

Accordingly, the decision signal BUMP_OS of a logic "high" level may indicate that the coupling of the bump 340 and the first and second metals 330A and 330B is normal, and the decision signal BUMP_OS of a logic "low" level indicates that the coupling of the bump 340 and the first and second metals 330A and 330B is not normal.

The semiconductor system, in accordance with the embodiment of the present invention, tests whether or not the bump is coupled with the two or more metals to improve the reliability of the semiconductor system by linking the semiconductor controller and the semiconductor chip.

The semiconductor system, in accordance with the embodiments of the present invention, detects whether or not the bump and the two or more metals, which are formed in the upper portion of the penetrating electrode, are coupled with each other so that the reliability of the semiconductor system may be improved.

While the present invention has been described with respect to specific embodiments, it should be noted that the embodiments are for describing, not limiting, the present invention. Further, it should be noted that the present invention may be achieved in various ways through substitution, change, and modification by those skilled in the art without departing from the scope of the present invention as defined by the following claims.

What is claimed is:

1. A semiconductor device, comprising:
   a semiconductor chip;
   a penetrating electrode, which is formed to penetrate the semiconductor chip;
   two or more metals, which are formed in the upper portion of the penetrating electrode;
   a bump, which is formed to contact the upper portions of the metals and supplies a data signal inputted from an external source to the metals;
   a detection block suitable for detecting whether the bump is coupled with the metals by comparing voltage levels of the metals and generating a decision signal; and
   a signal output block suitable for outputting the decision signal externally.

2. The semiconductor device of claim 1, wherein the metals are isolated and not coupled with each other.

3. The semiconductor device of claim 1, wherein the detection block includes:
   a level setting unit suitable for setting the voltage levels of the metals to an initial level in response to a control signal that is internally generated when the voltage levels of the metals float; and
   a level comparison unit suitable for comparing the voltage levels of the metals with each other and outputting the decision signal.

4. The semiconductor device of claim 3, wherein the level setting unit includes a plurality of transistors, which are electrically connected to the metals and drive the voltage levels of the metals to the initial level when the voltage levels of the metals float and do not drive the voltage levels of the metals to the initial level when the voltage levels of the metals do not float.

5. The semiconductor device of claim 1, wherein the signal output block includes;
   a selection unit suitable for selectively outputting the decision signal in response to a test mode signal that is generated based on a read command; and
   an output buffer unit, which is coupled with the metals and transmits a signal outputted from the selection unit to the metals.

6. The semiconductor device of claim 1, further comprising:
   an input buffer block, which is coupled with the metals and receives the data signal in response to a write command; and
   a core block suitable for storing the data signal inputted from the input buffer block.

7. A semiconductor system, comprising:
   a semiconductor chip; and
   a semiconductor controller suitable for controlling a test operation by transmitting a command signal and a data signal to the semiconductor chip and determining a test result in response to a decision signal transmitted from the semiconductor chip,
   wherein the semiconductor chip includes:
   a penetrating electrode, which is formed to penetrate the semiconductor chip;
   two or more metals, which are formed in the upper portion of the penetrating electrode;
   a bump, which is formed to contact the upper portions of the metals and supplies the data signal to the metals in response to the command signal;
   a detection block suitable for detecting whether the bump is coupled with the metals by comparing voltage levels of the metals with each other and generating the decision signal; and
   a signal output block suitable for outputting the decision signal in response to a read command among the command signals.

8. The semiconductor system of claim 7, wherein the metals are isolated from each other and not coupled with each other.

9. The semiconductor system of claim 7, wherein the detection block includes:
   a level setting unit suitable for setting the voltage levels of the metals to an initial level in response to a test control signal that is internally generated when the voltage levels of the metals float; and
   a level comparison unit suitable for comparing the voltage levels of the metals with each other and outputting the decision signal.

10. The semiconductor system of claim 9, wherein the level setting unit includes a plurality of transistors, which are electrically connected to the metals and drive the voltage levels of the metals to the initial level when the voltage levels of the metals float and do not drive the voltage levels of the metals to the initial level when the voltage levels of the metals do not float.

11. The semiconductor system of claim 7, wherein the signal output block includes;
    a selection unit suitable for selectively outputting the decision signal in response to a test mode signal that is generated based on the read command; and
    an output buffer unit, which is coupled with the metals and transmits a signal outputted from the selection unit to the metals.

12. The semiconductor system of claim 7, wherein the semiconductor chip includes:
    an input buffer block, which is coupled with the metals and receives the data signal in response to a write command among the command signals; and
    a core block suitable for storing the data signal inputted from the input buffer block.

13. The semiconductor system of claim 7, further comprising:
    an interposer line suitable for coupling the semiconductor controller with the semiconductor chip.

14. The semiconductor system of claim 13, wherein the semiconductor controller includes:
    a controller output buffer unit suitable for transmitting the data signal to the bump through the interposer line in response to the write command that is internally generated;
    a controller input buffer unit suitable for receiving the decision signal transmitted from the bump through the interposer line in response to the read command that is internally generated; and
    a controller level setting unit suitable for setting the interposer line to an initial level when the interposer line floats.

15. The semiconductor system of claim 14, wherein the controller level setting unit includes a transistor, which is electrically connected to the interposer line and drives the voltage level of the interposer line to the initial level when the voltage level of the interposer line floats and does not drive the voltage level of the interposer line to the initial level when the voltage level of the interposer line does not float.

* * * * *